(12) United States Patent  
Kantake et al.

(10) Patent No.: US 8,604,773 B2  
(45) Date of Patent: Dec. 10, 2013

(54) RECEIVING APPARATUS, TEST APPARATUS, RECEIVING METHOD, AND TEST METHOD

(75) Inventors: Shusuke Kantake, Gunma (JP); Hidenobu Matsumura, Gunma (JP)

(73) Assignee: Advantest Corporation, Tokyo (JP)

( * ) Notice: Subject to any disclaimer, the term of this patent is extended or adjusted under 35 U.S.C. 154(b) by 175 days.

(21) Appl. No.: 12/939,967

(22) Filed: Nov. 4, 2010

(65) Prior Publication Data

US 2011/0115468 A1   May 19, 2011

Related U.S. Application Data

(63) Continuation of application No. PCT/JP2009/006203, filed on Nov. 18, 2009.

(51) Int. Cl.
  *G01R 25/00* (2006.01)
(52) U.S. Cl.
  USPC ..................................... 324/76.77
(58) Field of Classification Search
  USPC .......... 324/762.01–762.1, 754.01–754.3, 324/750.01–750.3; 257/48; 702/69, 66, 67
  See application file for complete search history.

(56) References Cited

U.S. PATENT DOCUMENTS

| 7,756,654 | B2 * | 7/2010 | Yamamoto et al. ............. 702/69 |
| 2005/0025274 | A1 | 2/2005 | Rivoir |
| 2005/0155986 | A1 | 7/2005 | Oshima et al. |
| 2005/0271179 | A1 | 12/2005 | Hasegawa et al. |
| 2009/0048796 | A1 | 2/2009 | Yamamoto et al. |
| 2010/0128538 | A1 | 5/2010 | Watanabe et al. |
| 2010/0308856 | A1 | 12/2010 | Watanabe et al. |

FOREIGN PATENT DOCUMENTS

| JP | 2003-315428 A | 11/2003 |
| JP | 2004-127455 A | 4/2004 |
| JP | 2004-340925 A | 12/2004 |
| WO | 2008/114508 A1 | 9/2008 |
| WO | 2008/136301 A1 | 11/2008 |

OTHER PUBLICATIONS

Written Opinion (PCT/ISA/237) issued in PCT/JP2009/006203 mailed in Feb. 2010.

Japanese Office Action dated Jan. 4, 2011 in a counterpart Japanese patent application JP2010-544109. Concise Explanation of Relevance: The Japanese Office Action rejects claims in the Japanese application.

(Continued)

*Primary Examiner* — Tung X Nguyen

(57) ABSTRACT

Provided is a receiving method and a receiving apparatus comprising a multi-strobe generating section that generates a multi-strobe including a plurality of strobes having different phases with respect to a reception signal; an acquiring section that acquires the reception signal using each of the strobes; a detecting section that detects a change position at which a value of the reception signal changes, based on the acquisition result of the acquiring section; and a selecting section that selects, as a reception data value, the value of the reception signal acquired using a strobe at a position shifted by a predetermined phase from the change position. The receiving apparatus may further comprise a reference clock generating section that generates a reference clock having a preset period, and the multi-strobe generating section generates the multi-strobe for each pulse of the reference clock.

16 Claims, 12 Drawing Sheets

(56) References Cited

OTHER PUBLICATIONS

International Search Report (ISR) issued in PCT/JP2009/006203 (parent application) mailed in Feb. 2010 for Examiner consideration, citing U.S. Patent Application Publication Nos. US2005/0156622 and US2005/0025274, and Foreign Patent document Nos. WO2008/114508, JP2003-315428, JP2004-340925, and WO2008/136301.

TW Office Action/ Search Report and Computer Translation of Search Report Dated Mar. 29, 2013; Application No. 099138383.

* cited by examiner

RECEIVING APPARATUS, TEST APPARATUS, RECEIVING METHOD, AND TEST METHOD

BACKGROUND

1. Technical Field

The present invention relates to a receiving apparatus, a test apparatus, a receiving method, and a test method.

2. Related Art

A device such as a DDR-SDRAM is known that outputs in parallel a data signal and a clock signal indicating acquisition timing of the data signal. A test apparatus for testing such a device uses a multi-strobe function to test the phase relationship between the data signal and the clock signal.
Patent Document 1: Japanese Patent Application Publication No. 2003-315428
Patent Document 2: Japanese Patent Application Publication No. 2004-127455

When testing a device that outputs the data signal and the clock signal in parallel, the test apparatus must make an adjustment prior to testing so that the multi-strobe is generated at a suitable timing. However, it is difficult for the test apparatus to make this adjustment automatically.

SUMMARY

Therefore, it is an object of an aspect of the innovations herein to provide a receiving apparatus, a test apparatus, a receiving method, and a test method, which are capable of overcoming the above drawbacks accompanying the related art. The above and other objects can be achieved by combinations described in the independent claims.

According to a first aspect related to the innovations herein, provided is a receiving apparatus comprising a multi-strobe generating section that generates a multi-strobe including a plurality of strobes having different phases with respect to a reception signal; an acquiring section that acquires the reception signal using each of the strobes; a detecting section that detects a change position at which a value of the reception signal changes, based on the acquisition result of the acquiring section; and a selecting section that selects, as a reception data value, the value of the reception signal acquired using a strobe at a position shifted by a predetermined phase from the change position.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
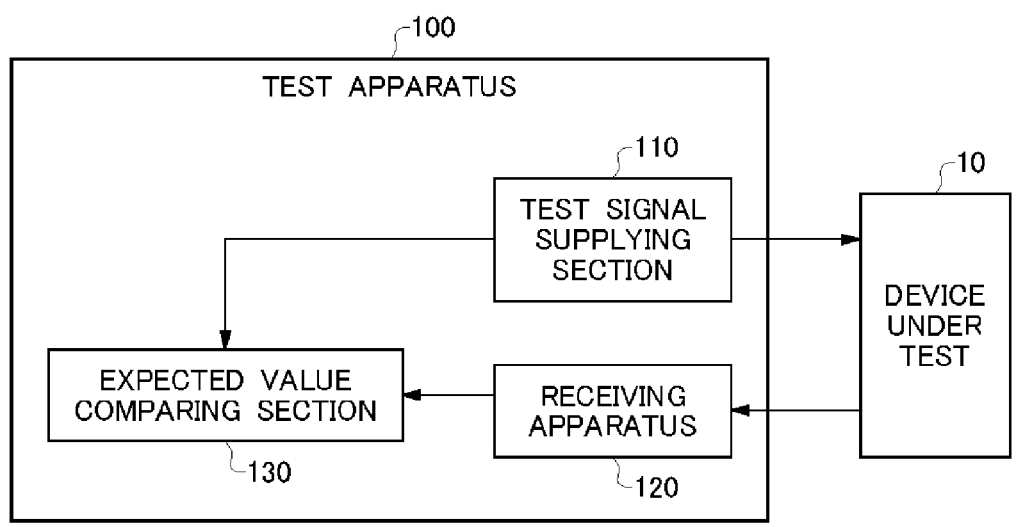
FIG. 1 shows a configuration of a test apparatus 100 according to an embodiment of the present invention, along with a device under test 10.

FIG. 1 shows a configuration of a test apparatus 100 according to an embodiment of the present invention, along with a device under test 10. The test apparatus 100 tests the device under test 10, which may be an analog circuit, a digital circuit, a memory, a system-on-chip (SOC), or the like. The test apparatus 100 inputs to the device under test 10 a test signal based on a test pattern for testing the device under test 10, and judges acceptability of the device under test 10 based on an output signal output by the device under test 10 in response to the test signal.

The test apparatus 100 includes a test signal supplying section 110, a receiving apparatus 120, and an expected value comparing section 130. The test signal supplying section 110 supplies the test signal to the device under test 10. The test signal supplying section 110 transmits to the device under test 10 the test signal based on the test pattern for testing the device under test 10. The test signal supplying section 110 may generate an expected value of a response signal output by the device under test 10 in response to the test signal. The test signal supplying section 110 may be connected to a plurality of devices under test 10 to test these devices under test 10.

The receiving apparatus 120 receives, as a reception signal, the response signal output by the device under test 10. The receiving apparatus 120 uses a multi-strobe including a plurality of strobes to detect a change position at which the value of the reception signal changes, and sets as a reception data value the reception signal acquired by a strobe at a position that is shifted by a predetermined phase from the change position.

The expected value comparing section 130 compares the reception data value received by the receiving apparatus 120 to a predetermined value. The expected value comparing section 130 may receive the expected value from the test signal supplying section 110. The test apparatus 100 may judge the acceptability of the device under test 10 based on the comparison result of the expected value comparing section 130.

Figure 2:
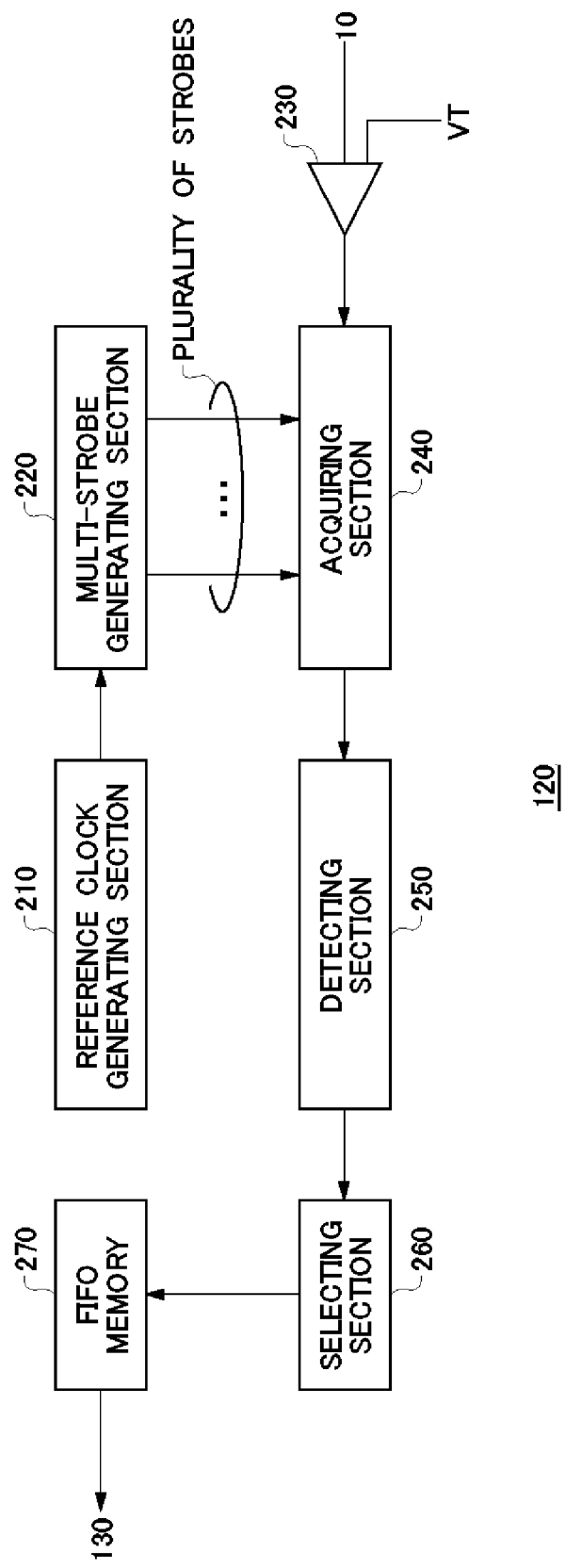
FIG. 2 shows a configuration of the receiving apparatus 120 according to the present embodiment.

FIG. 2 shows a configuration of the receiving apparatus 120 according to the present embodiment. The receiving apparatus 120 includes a reference clock generating section 210, a multi-strobe generating section 220, a level comparator 230, an acquiring section 240, a detecting section 250, a selecting section 260, and a FIFO memory 270.

The reference clock generating section 210 generates a reference clock with a preset period. The reference clock generating section 210 includes a timing generator that operates according to a system clock of the test apparatus 100, and generates the reference clock to have substantially the same period as the signal output from the device under test 10 by thinning the system clock with the timing generator to have substantially the same pulse frequency as the reference clock and then setting the pulse intervals to be the same as those of the reference clock.

The reference clock generating section 210 may be an oscillation circuit that uses a crystal oscillator. The reference clock generating section 210 may generate the clock signal in synchronization with a trigger signal or the like. Instead, the reference clock generating section 210 may generate a reference clock signal that is synchronized with a clock signal from the outside and has a frequency obtained by multiplying the frequency of the clock signal by an integer value. The reference clock generating section 210 may output the reference clock signal in synchronization with the signal output by the device under test 10, or may output the reference clock signal out of synchronization with the signal output by the device under test 10.

The multi-strobe generating section 220 generates the multi-strobe to include a plurality of strobes that each have a different phase relative to the reception signal. The multi-strobe generating section 220 may generate a multi-strobe for each pulse of the reference clock received from the reference clock generating section 210. The multi-strobe generating section 220 may generate a plurality of strobes that are, for each prescribed interval, delayed from the reference phase of the pulse of the reference clock.

The level comparator 230 compares the level of the reception signal received from the outside to a threshold value, and outputs the reception signal expressed as a logic value. The acquiring section 240 acquires the value of the reception signal output from the level comparator 230, at the timing of each of the strobes generated by the multi-strobe generating section 220.

The detecting section 250 detects the change position at which the value of the reception signal changes, based on the acquisition results of the acquiring section 240. Specifically, the detecting section 250 determines which of the strobes was used to detect the edge position of the reception signal, based on the change position of the values of the reception signal arranged in a time sequence. The detecting section 250 outputs to the selecting section 260 the position of the strobe used to detect the edge position of the reception signal.

The selecting section 260 selects, as the reception data value, the value of the reception signal acquired using the strobe at a position shifted by a predetermined phase from the change position. For example, the selecting section 260 may select as the reception data value the value of the reception signal acquired using the strobe at a position shifted from the change position by 0.5 UI (Unit Interval: Inverse of the clock frequency). The selecting section 260 transmits the selected reception data to the FIFO memory 270.

The FIFO memory 270 performs first-in first-out buffering on the reception data values sequentially selected by the selecting section 260, and outputs a reception data value each cycle. The FIFO memory 270 can store a plurality of reception data values, and therefore buffering can be performed without losing reception data values even if detection of the reception signal using the multi-strobe is performed in a plurality of cycles at a random timing. The receiving apparatus 120 described above detects the change position of the reception signal acquired using the multi-strobe and sets, as the reception data value, the value of the signal acquired using the strobe at a position shifted from the change position by a predetermined phase.

Figure 3:
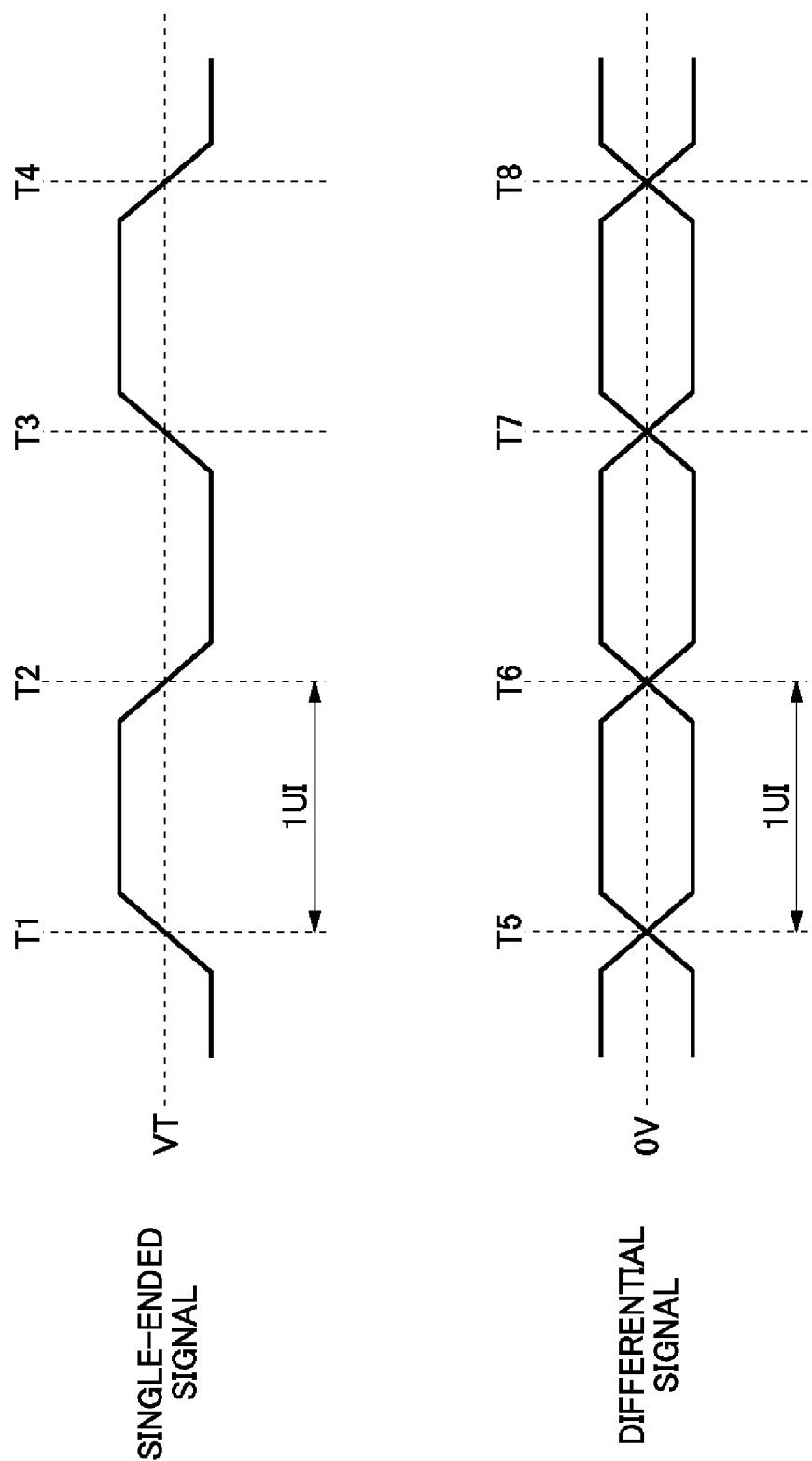
FIG. 3 shows exemplary change positions of a reception signal according to the present embodiment.

FIG. 3 shows exemplary change positions of a reception signal according to the present embodiment. When receiving a single-ended signal from the device under test 10, the receiving apparatus 120 sets the comparison voltage of the level comparator 230 to be a threshold voltage VT in order to detect the change position. The receiving apparatus 120 may set VT to be the intermediate voltage between the high level and the low level of the single-ended signal. In this way, the receiving apparatus 120 can detect the change positions to be timings at which the signal voltage exceeds VT while rising from the low level to the high level, which in FIG. 3 are T1 and T3, and timings at which the signal voltage drops below VT while falling from the high level to the low level, which in FIG. 3 are T2 and T4.

When receiving a differential signal from the device under test 10, the receiving apparatus 120 may set the threshold voltage VT of the level comparator 230 to be 0 V. In this way, the receiving apparatus 120 detects the change positions to be the cross timings of the differential signal, which in FIG. 3 are T5, T6, T7, and T8. Here, 1 UI (Unit Interval) is the time interval from one change position to the next change position in the reception signal.

Figure 4:
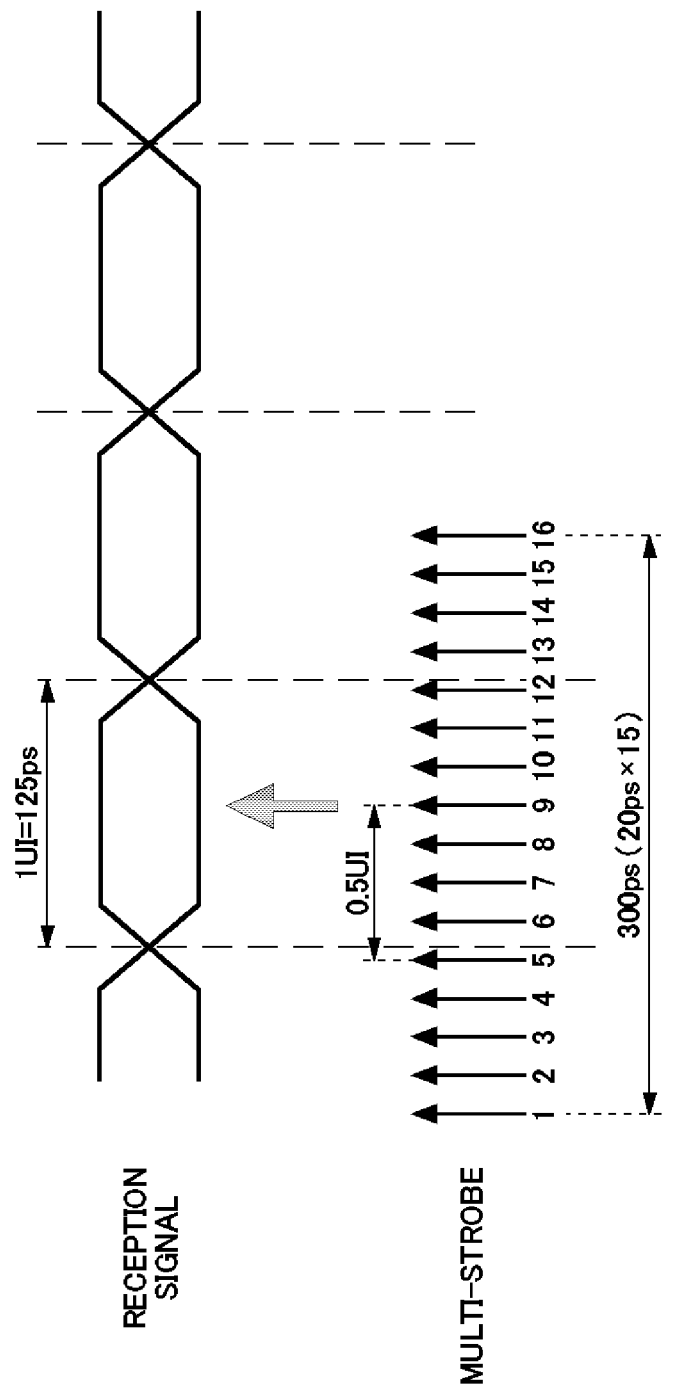
FIG. 4 shows an exemplary method of selecting the strobe position performed by the receiving apparatus 120 according to the present embodiment.

FIG. 4 shows an exemplary method of selecting the strobe position performed by the receiving apparatus 120 according to the present embodiment. In the present embodiment, the receiving apparatus 120 receives, as a single-ended signal, a data signal in which 1 UI is 125 ps. In this example, the multi-strobe generating section 220 generates a multi-strobe that includes 16 strobes per cycle wherein the interval between each strobe is 20 ps. In this case, the acquiring section 240 can acquire the value of the change position at least two locations of the reception signal, since 1 cycle of the multi-strobe is 300 ps and 1 UI is 125 ps.

In order to detect both rising edges and falling edges of the reception signal, the receiving apparatus 120 includes two sets of a multi-strobe generating section 220, a level comparator 230, and an acquiring section 240. For example, when the first change position is detected between the fifth and sixth strobes, one of the acquiring sections 240 acquires data indicating that the value at the first to fifth strobes is low level and the value at the sixth strobe onward is high level. The detecting section 250 that receives these values acquired by the multi-strobe may determine the change position to be the fifth strobe position.

The other acquiring section 240 acquires data indicating that the value up to the twelfth strobe is high level and the value from the thirteenth strobe onward is low level. The detecting section 250 that receives these values acquired by the multi-strobe may determine the change position to be the twelfth strobe position. Instead, the receiving apparatus 120 may detect the change positions using one set of a multi-strobe generating section 220, a level comparator 230, and an acquiring section 240.

For example, according to one of the acquiring sections, the value from the first to fifth strobes is low level and the value from the sixth strobe to the twelfth strobe is high level, and therefore the value is low level again from the thirteenth strobe onward. Accordingly, when detecting the rising and falling edges with a single threshold value, the detection of a change position can be achieved with one set of a multi-strobe generating section 220, a level comparator 230, and an acquiring section 240.

The selecting section 260 receives information concerning the change position detected by the detecting section 250 and selects, as the reception data value, the value of the reception signal acquired using the strobe at a position shifted from the change position by a predetermined amount. For example, the predetermined phase may be 0.5 UI, which is 80 ps in this case, and the selecting section 260 may select, as the reception data value, the value acquired using the ninth strobe, which is shifted by 80 ps from the fifth strobe corresponding to the change position.

In the above example, the selecting section 260 selects the ninth strobe, which is delayed by 80 ps from the fifth strobe, but the selecting section 260 may instead select the first strobe, which is 80 ps earlier than the fifth strobe. In this way, the selecting section 260 selects the reception data value using the change position as a reference, and therefore the receiving apparatus 120 can select the reception data value of the reception signal without using a complicated synchronization circuit or the like.

In the receiving apparatus 120, the selecting section 260 may select two or more sequential reception data values from the acquisition results, in response to two or more change positions being detected from the acquisition results acquired using the plurality of strobes. In the above example, one of the two acquiring sections 240 acquires data indicating a rising edge where the value that is low level at the first to fifth strobes becomes high level from the sixth strobe onward and the other acquiring section 240 acquires data indicating a falling edge where the value that is high level up to the twelfth strobe becomes low level from the thirteenth strobe onward. Accordingly, the detecting section 250 may transmit to the selecting section 260, as the change positions, the fifth strobe position and the twelfth strobe position.

As a result, in addition to the ninth reception data value, the selecting section 260 may also select as a reception data value the value acquired at the sixteenth strobe, which is shifted by 80 ps from the twelfth strobe corresponding to a second change position. When the change position is the thirteenth strobe or later, there is no strobe that is shifted 80 ps therefrom, and so the selecting section 260 cannot select a reception data value corresponding to the second change position. In cases like this where the set number of reception data values cannot be selected, the selecting section 260 may transmit to the FIFO memory 270 information concerning the strobe positions or the like, selection results of the reception data corresponding to change positions that were able to be selected, and the number of change positions that were not able to be selected.

Instead, the selecting section 260 may select as the reception data values the values acquired at the first strobe, which is 80 ps earlier than the first change position, and the eighth strobe, which is 80 ps earlier than the change position. In this way, two sequential pieces of reception data can be obtained in a single cycle of the multi-strobe. Furthermore, two or more sequential reception data values can be obtained by setting a suitable strobe interval and number of strobes for the multi-strobe signal according to the period of the reception signal.

The reference clock generating section 210 may generate the reference clock to have the same period as the reception signal. For example, the receiving apparatus 120 can acquire at least one piece of reception data in one cycle of the multi-strobe, and can therefore acquire sequential pieces of reception data from the reception signal by setting the generation of the multi-strobe to be less than or equal to the period of the reception signal.

The multi-strobe generating section 220 may generate a multi-strobe that includes strobes spread over a time width that exceeds one period of the reception signal. For example, in the case of a multi-strobe composed of the sixth strobe to the twelfth strobe, which is a time width of 120 ps and less than one period of the reception signal, the detecting section 250 cannot detect a change position. Accordingly, the receiving apparatus 120 cannot select a reception data value at a strobe position delayed by 0.5 periods from the change position.

On the other hand, in the case of multi-strobe composed of the sixth to thirteenth strobes, which is a time width of 140 ps and greater than one period of the reception signal, the detecting section 250 can detect the twelfth strobe as the change position. Based on this detection, the selecting section 260 can select the eighth strobe, which is 80 ps earlier than the twelfth strobe.

As another example, in the case of a multi-strobe composed of the fifth to twelfth strobes, which is a time width of 140 ps and greater than one period of the reception signal, the detecting section 250 can detect the fifth strobe as the change position. Based on this detection, the selecting section 260 can select the ninth strobe, which is 80 ps later than the fifth strobe. In other words, by generating the multi-strobe to include a plurality of strobes spread over a time width exceeding one period of the reception signal, the receiving apparatus 120 can select a reception data value at a strobe position that is 0.5 periods earlier or later than the change position.

Here, the multi-strobe generating section 220 may generate the multi-strobe to include a plurality of strobes spread over a time width greater than or equal to 1.5 periods of the reception signal. For example, in the case of a multi-strobe composed of the sixth to fifteenth strobes, which has a time width that is less than or equal to 1.5 periods of the reception signal, the detecting section 250 can detect the change position to be the twelfth strobe. However, the selecting section 260 cannot select a strobe that is 80 ps later than the twelfth strobe based on this detection result.

In other words, when the multi-strobe is generated with a time width that is less than or equal to 1.5 periods of the reception signal, the receiving apparatus 120 cannot select a reception data value at a strobe position that is delayed by 0.5 periods. On the other hand, in the case of a multi-strobe composed of the sixth to sixteenth strobes, which has a time width of 220 ps that is greater than or equal to 1.5 periods of the reception signal, the selecting section 260 can select the sixteenth strobe, which is delayed by 80 ps from the twelfth strobe.

In the case of a multi-strobe composed of the fifth to fifteenth strobes, which has a time width of 220 ps that is greater than or equal to 1.5 periods of the reception signal, the detecting section 250 can detect both the fifth and twelfth strobes as change positions. Based on the detection result, the selecting section 260 can select the ninth strobe, which is delayed by 80 ps from the fifth strobe. In other words, by generating a multi-strobe that includes strobes spread over a time width that is greater than or equal to 1.5 periods of the reception signal, the receiving apparatus 120 can select a reception data value at a strobe position delayed by 0.5 periods.

The multi-strobe generating section 220 may generate the multi-strobe signal to include a plurality of strobes spread at substantially uniform intervals over a time width that is greater than or equal to a time width obtained by adding double this time interval to 1.5 periods of the reception signal. As another example, the multi-strobe generating section 220 may generate the multi-strobe signal to include a plurality of strobes spread over a time width that is greater than or equal to a time width obtained by adding the time interval to 1.5 periods of the reception signal. For example, in the case of a multi-strobe composed of the fifth to sixteenth strobes, the detecting section 250 can detect both the fifth and twelfth strobes as change positions.

Based on the detection results, the selecting section 260 can select the ninth strobe, which is delayed by 80 ps from the fifth strobe, and the sixteenth strobe, which is delayed by 80 ps from the twelfth strobe. In other words, in the case of a multi-strobe including strobes spread over a time interval that is greater than or equal to a time interval obtained by adding double the time interval to 1.5 periods of the reception signal, the receiving apparatus 120 can select two or more sequential reception data values.

If there are no strobe signals at positions shifted from a change position by the predetermined phase, instead of selecting the reception data value based on the acquisition results of the current cycle, the selecting section 260 selects as the reception data values the value of the reception signal acquired using strobes corresponding to these positions in the previous cycle or next cycle. The device under test 10 may transmit a signal having frequency fluctuation such as jitter or wander to the receiving apparatus 120 as the reception signal, and strobes at positions shifted from the change positions by the predetermined phase do not always exist. A method for selecting strobe positions in such cases is described below.

Figure 5:
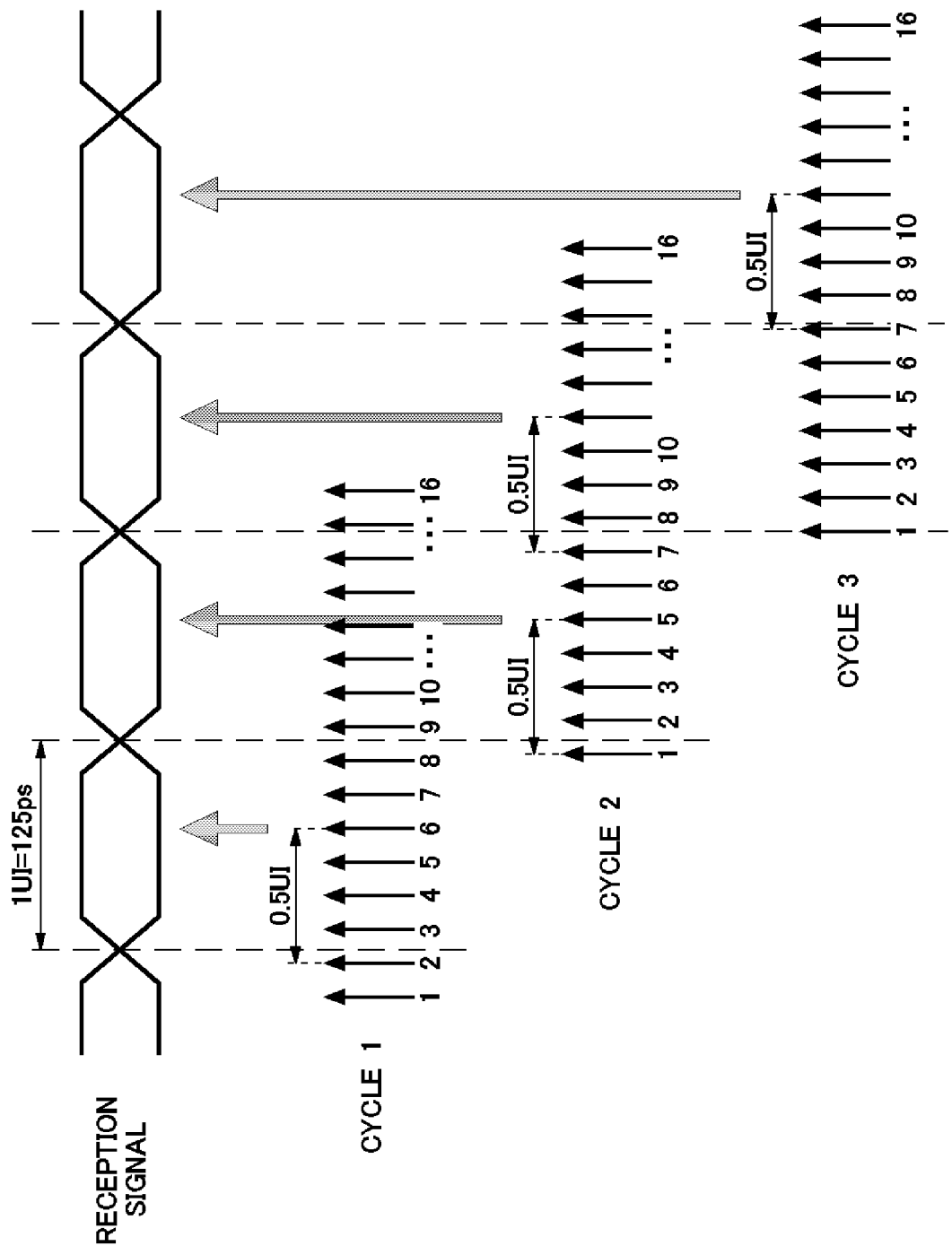
FIG. 5 shows an exemplary method for selecting strobe positions when the data phase becomes earlier, as performed by the receiving apparatus 120 of the present embodiment.

FIG. 5 shows an exemplary method for selecting strobe positions when the data phase becomes earlier, as performed by the receiving apparatus 120 of the present embodiment. The following describes an example in which jitter in the period of the reception signal received from the device under test 10 causes a difference in period between the reception signal and the reference clock, and the receiving apparatus 120 receives data whose phase becomes gradually earlier with respect to the reference clock. In the present embodiment, the receiving apparatus 120 receives as the reception signal a differential signal in which 1 UI is 125 ps, and the multi-strobe generating section 220 generates a multi-strobe that includes sixteen strobes per cycle with an interval of 20 ps between strobes.

The detecting section 250 detects the second strobe position in the multi-strobe generated in cycle 1 as a change position, and the selecting section 260 selects the value acquired at the sixth strobe delayed by 0.5 UI therefrom to be the reception data value. In cycle 2, the detecting section 250 detects the first strobe position as a change position, and the selecting section 260 can select the value acquired at the fifth strobe, which is delayed from the first strobe position by 0.5 UI, to be the reception data value.

In cycle 3, however, when the frequency continues changing such that the change position moves to be before the first strobe, the detecting section 250 cannot detect this change position. Therefore, the detecting section 250 detects the seventh strobe position as a second change position in cycle 2, and transmits to the selecting section 260 information concerning the two change positions. The selecting section 260 selects as the second reception data value the value acquired using the eleventh strobe, which is delayed by 0.5 UI.

In cycle 3, when the frequency further changes and the change position moves to be further before the first strobe, the detecting section 250 cannot detect this change position but can detect the second change position. The selecting section 260 selects as the reception data value the value obtained using the eleventh strobe corresponding to the second change position. In cycles 3 and onward, the detecting section 250 may continue to detect the second change position as the first change position.

In this way, the selecting section 260 can select the sixth strobe in cycle 1, the fifth and eleventh strobes in cycle 2, and the eleventh strobe in cycle 3 as four sequential reception data values. In other words, even if the data phase of the reception signal becomes gradually earlier due to jitter or the like, the dropping of data due to cycle slip can be prevented by selecting two pieces of suitable data in a suitable cycle.

Figure 6:
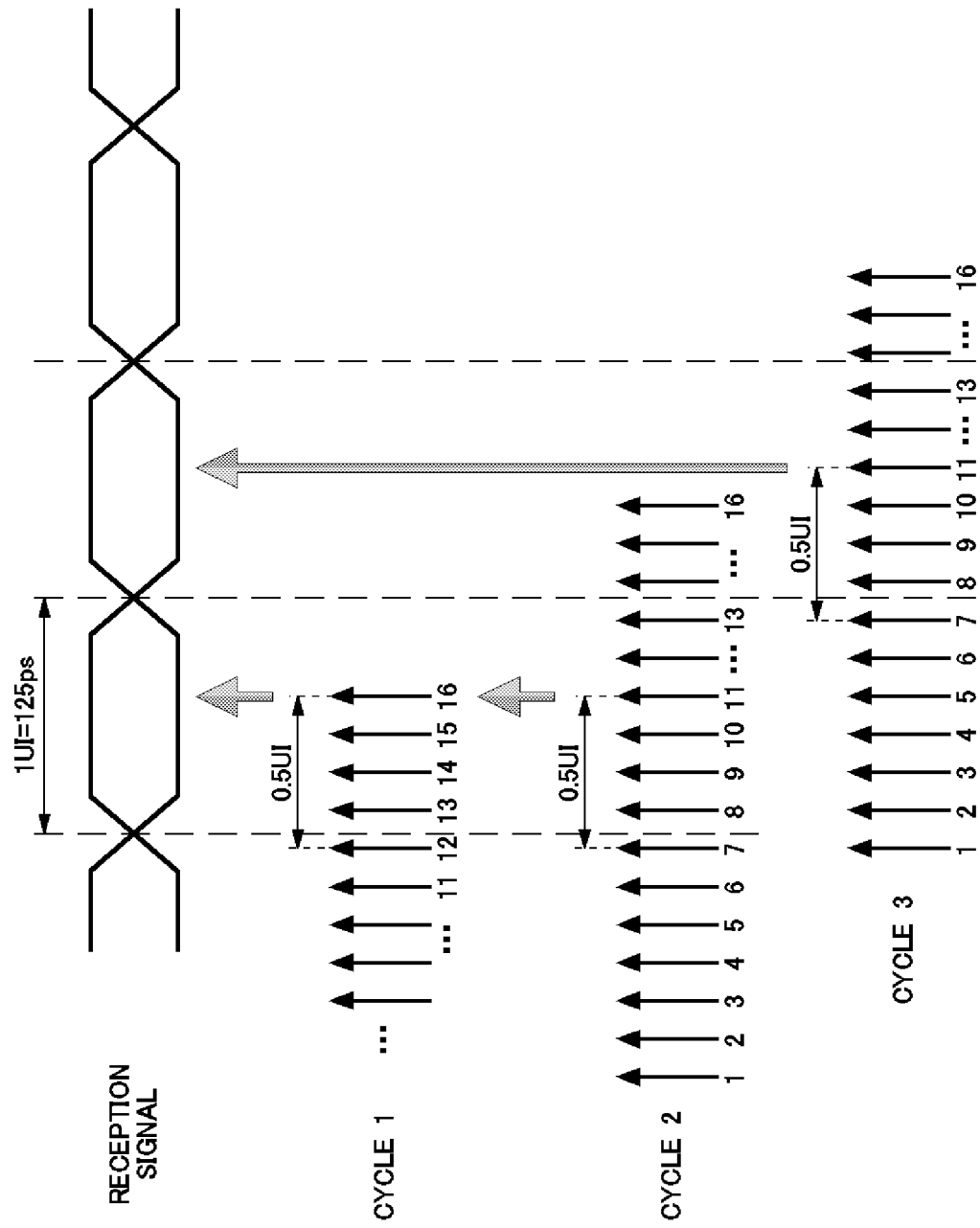
FIG. 6 shows an exemplary method for selecting strobe positions when the data phase becomes later, as performed by the receiving apparatus 120 of the present embodiment.

FIG. 6 shows an exemplary method for selecting strobe positions when the data phase becomes later, as performed by the receiving apparatus 120 of the present embodiment. The following describes an example in which jitter in the period of the reception signal received from the device under test 10 causes a difference in period between the reception signal and the reference clock, and the receiving apparatus 120 receives data whose phase becomes gradually later with respect to the reference clock. In the present embodiment, the receiving apparatus 120 receives as the reception signal a differential signal in which 1 UI is 125 ps, and the multi-strobe generating section 220 generates a multi-strobe that includes sixteen strobes per cycle with an interval of 20 ps between strobes.

The detecting section 250 detects the twelfth strobe position in the multi-strobe generated in cycle 1 as a change position, and the selecting section 260 selects the value acquired at the sixteenth strobe delayed by 0.5 UI to be the reception data value. In this example, the frequency change causes the data phase of the reception signal to become later, such that the change position moves to the thirteenth strobe position in cycle 2 of the multi-strobe. In cycle 2 the detecting section 250 detects the thirteenth strobe position as a change position, but the selecting section 260 cannot select a value since the strobe delayed by 0.5 UI is after the sixteenth strobe.

Therefore, in cycle 2, the detecting section 250 detects the seventh strobe position, which is one change position earlier, and transmits information concerning this change position to the selecting section 260. The selecting section 260 selects as the reception data value the value acquired using the eleventh strobe delayed by 0.5 UI. In cycle 3, the detecting section 250 detects as the first change position the change position corresponding to the seventh strobe in cycle 2. Accordingly, in cycle 3, the detecting section 250 detects the seventh strobe position as the change position, and the selecting section 260 selects as the reception data value the value obtained at the eleventh strobe.

In this way, the selecting section 260 can select the values acquired at the sixteenth strobe in cycle 1 and the eleventh strobe in cycle 3 as two sequential reception data values. In other words, even if the data phase of the reception signal becomes gradually later due to jitter or the like, the duplication of data can be prevented by not selecting data in a suitable cycle. With this method for selecting strobe positions for a reception signal including jitter, the receiving apparatus 120 can select suitable reception data values without using a complicated synchronization circuit.

The signal received by the receiving apparatus 120 according to the embodiment described above was exemplified as a signal in which a high level and a low level repeated each period, but the actual signal used may maintain a high level or low level for two or more continuous periods, such that a change position cannot be detected for each period. When the detecting section 250 cannot detect a change position based on the acquisition results of the acquiring section 240, the detecting section 250 outputs to the selecting section 260, as the change position corresponding to the current reception data of the reception signal, the detected change position corresponding to the previous reception data in the reception signal.

In this way, when a change position cannot be detected in a reception signal with relatively little jitter, the receiving apparatus 120 can select a suitable reception data value without requiring a complicated synchronization circuit or the like by using the position detected as the previous change position. Furthermore, when a change position cannot be detected in a reception signal containing jitter, the receiving apparatus 120 may determine the change position using the interpolation described below.

When a change position cannot be detected based on the acquisition result of the acquiring section 240, the detecting section 250 interpolates a change position corresponding to the current reception data of the reception signal based on two or more change positions detected for two or more pieces of reception data that are not in the current reception data of the reception signal. For example, when the change position changes to be the fifth strobe position in the first cycle, the sixth strobe position in the second cycle, the seventh strobe position in the third cycle, and undetectable in the fourth cycle, the detecting section 250 may interpolate the unit-change in this pattern to determine the change position in the fourth cycle to be the eighth strobe position. For example, the detecting section 250 can select a suitable reception data value when the frequency of the reception signal changes relatively slowly due to wander or the like by performing interpolation based on more pieces of reception data.

The detecting section 250 interpolates a change position corresponding to the current reception data of the reception signal based on two or more detected change positions corresponding to two or more pieces of prior reception data in the reception signal. When a change position cannot be detected, the detecting section 250 may interpolate the change position based on information concerning two or more previous cycles in which detection was achieved. As a result, when the frequency of the reception signal changes relatively quickly due to jitter, for example, the detecting section 250 can select a suitable reception data value based on the variation in the immediately prior two cycles.

The detecting section 250 interpolates a change position in the current cycle of the reception signal based on two or more change positions detected in two or more cycles that include cycles before and after the current cycle of the reception signal. When a change position cannot be detected, the detecting section 250 may interpolate the change position based on two or more pieces of information concerning cycles before and after the current cycle where detection is achieved. As a result, the detecting section 250 can select a suitable reception data value even when the variation is fast, since the interpolation is performed based on periods before and after the variation of the change position.

The selecting section 260 selects as a reception data value a value of the reception signal acquired using a strobe at a position shifted by a predetermined phase from a change position detected in cycle that is a predetermined number of cycles earlier. As a result, the selecting section 260 can select suitable reception data values when the frequency experiences long-term variation.

The selecting section 260 selects as a reception data value a value of the reception signal acquired using a strobe at a position sifted by a predetermined phase from a position averaged from the change positions in a plurality of cycles. As a result, even when a short-term frequency variation or the like that does not affect the current cycle occurs, the selecting section 260 can select suitable reception data values while mitigating this effect.

Figure 7:
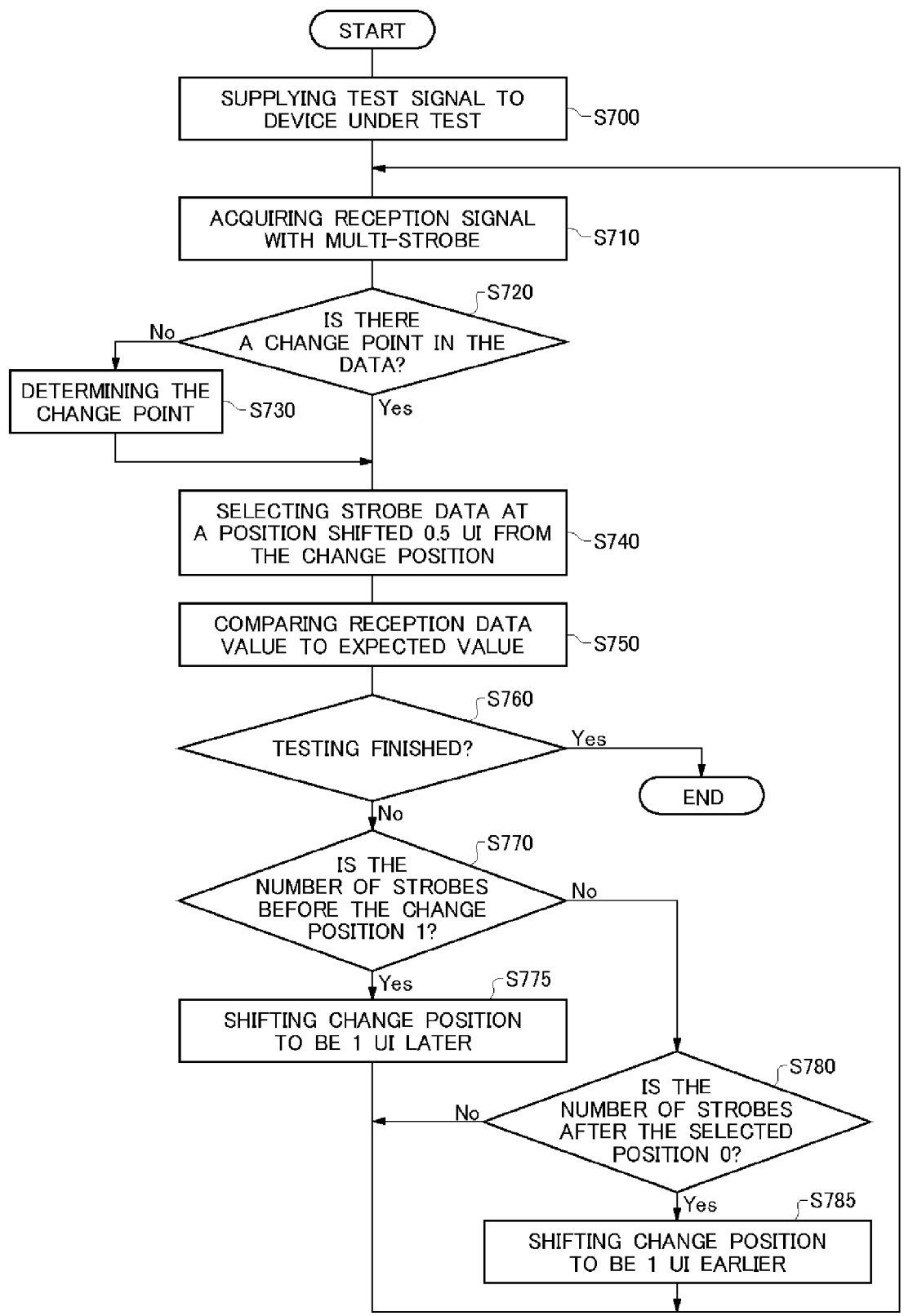
FIG. 7 shows an exemplary process flow of the test apparatus 100 according to the present embodiment.

FIG. 7 shows an exemplary process flow of the test apparatus 100 according to the present embodiment. The test signal supplying section 110 supplies the device under test 10 with the test signal (S700). The receiving apparatus 120 receives as the reception signal the response signal output by the device under test. Here, the receiving apparatus 120 acquires the reception signal using each of a plurality of strobes generated by the multi-strobe generating section 220 (S710).

The receiving apparatus 120 detects a change position at which the value of the reception signal changes, based on the acquisition result of the reception signal (S720). If there are no change positions, the receiving apparatus 120 determines a change position based on information concerning previous cycles (S730). Instead, if determining the change position based on information concerning later cycles, the receiving apparatus 120 may move to step S710 while holding the acquisition result of the reception signal, proceed to the subsequent cycle, and then determine the change position in the cycle whose data is held based on the change position in this subsequent cycle. In this case, the receiving apparatus 120 may perform the following processes for this current cycle and subsequent cycle simultaneously.

The receiving apparatus 120 selects as the reception data value a value of the reception signal acquired using a strobe at a position shifted by 0.5 UI from a change position (S740). If the data phase of the reception signal becomes earlier due to jitter or the like, the receiving apparatus 120 may prevent data dropping due to cycle slip by selecting two pieces of suitable data from suitable cycles. If the data phase of the reception signal becomes later due to jitter or the like, the receiving apparatus 120 may prevent data repetition by not selecting a piece of data in a suitable cycle.

The receiving apparatus 120 supplies the expected value comparing section 130 with the selected reception data value, and the expected value comparing section 130 compares the received reception data value to an expected value supplied from the test signal supplying section 110 (S750). The test apparatus 100 may judge acceptability of the device under test based on the results of the comparison between the reception data value and the expected value. The test apparatus 100 may continue testing if another response signal is output by the device under test 10 in response to the test signal supplied by the test signal supplying section 110, and may finish testing if there is no other response signal (S760).

If testing is continued, the receiving apparatus 120 checks whether the change position in the current cycle is at the position of the second strobe in the multi-strobe (S770). When the change position in the current cycle is at the position of the second strobe in the multi-strobe, the receiving apparatus 120 shifts the change position to be 1 UI later (S775) and then acquires the next cycle of the reception signal using the multi-strobe (S710).

When the change position of the current cycle is not the position of the second strobe in the multi-strobe, the receiving apparatus 120 checks whether the strobe selected as the reception data value is at the sixteenth strobe position (S780). When the strobe selected as the reception data value is at the sixteenth strobe position, the receiving apparatus 120 shifts the change position to be 1 UI earlier (S785) and then acquires the next cycle of the reception signal using the multi-strobe (S710).

The test apparatus 100 may perform testing by repeatedly performing the steps from S710 and onward, until no response signal is received from the device under test 10 for one test, until a predetermined time has passed, or until a predetermined reception data value is received. The test apparatus 100 of the present embodiment can test the device under test by suitably receiving a response signal including jitter or the like from device under test, without using a complicated synchronized signal or the like.

The above describes an exemplary process flow of the test apparatus 100 according to the present embodiment that involves judging whether to shift the change position based on where the change position of the current cycle is located in the multi-strobe. Instead, the test apparatus 100 may acquire a reception data value for each cycle based on two or more change positions, compare each of the strobe positions of the change positions in each cycle, and arrange the reception data values in a time sequence. For example, when there is no jitter in the response signal of the device under test, the test apparatus 100 can acquire the reception data values by selecting, from among two or more pieces of data acquired in one cycle, one piece of data based on the same change position, and arranging the data in the order in which it is acquired.

As another example, when the strobe positions of the change positions in a plurality of cycles are compared and it is judged that the data phase of the response signal from the device under test becomes earlier, the test apparatus 100 can acquire the reception data values by selecting two pieces of data based on two or more pieces of data acquired in one cycle, and arranging these pieces of data in the order in which they are acquired. As another example, when the strobe positions of the change positions in a plurality of cycles are compared and it is judged that the data phase of the response signal from the device under test becomes later, the test apparatus 100 can acquire the reception data values by stopping the selection of data from among two or more pieces of data acquired in one cycle, initiating selection of data from a subsequent cycle, and arranging the selected data in the order in which it is acquired.

Figure 8:
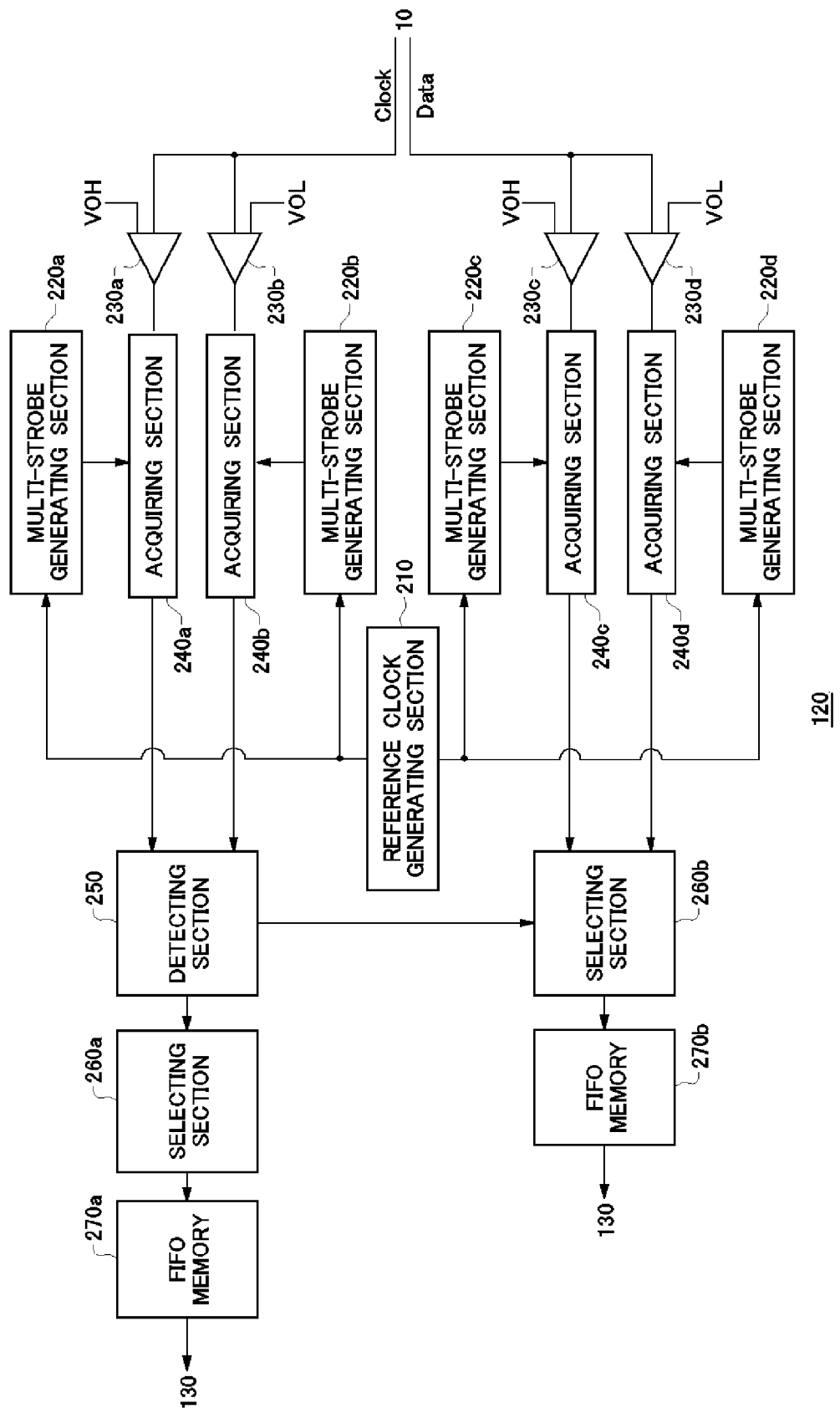
FIG. 8 shows a first modification of the receiving apparatus 120 according to the present embodiment.

FIG. 8 shows a first modification of the receiving apparatus 120 according to the present embodiment. The receiving apparatus 120 of the present modification adopts the same function and configuration as the receiving apparatus 120 shown in FIG. 2, and therefore components that are the same as those of the receiving apparatus 120 shown in FIG. 2 are given the same reference numerals and only differing points are included in the following description.

In FIG. 8, the device under test 10 may be a device such as a DDR-SDRAM (Double-Data-Rate Synchronous Dynamic Random Access Memory). In this case, the device under test 10 outputs a parallel transmission signal as a data signal and transmits a clock signal, which indicates a timing at which the data signal is acquired, as the reception signal.

The device under test 10 supplies the receiving apparatus 120 with the clock signal and the data signal as single-ended signals. Instead, the device under test 10 may supply the receiving apparatus 120 with the clock signal and/or the data signal as a differential signal. The reference clock generating section 210 supplies a reference clock for generating the multi-strobe to each of a plurality of multi-strobe generating sections 220a to 220d.

Level comparators 230a to 230d each compare the levels of the data signal and the clock signal input thereto to threshold values and output the results to the respective acquiring section 240a to 240d as reception signals indicating a logic value. For example, the level comparators 230a and 230c may have a threshold value VOH set therein in order to detect rising edges of the input signals, and the level comparators 230b and 230d may have a threshold value VOL set therein in order to detect falling edges of the input signals.

The acquiring sections 240a to 240d respectively acquire the values of the reception signals output by the level comparators 230a to 230d, at the timings of the strobes generated by the multi-strobe generating sections 220a to 220d. The detecting section 250 connected to the acquiring section 240a and the acquiring section 240b, which acquire the clock signal, detects change positions at which the value of the clock signal changes.

In other words, the detecting section 250 judges which strobe among the plurality of strobes is used to detect an edge position in the clock signal, from the change position in the temporally ordered clock signal values. The detecting section 250 then outputs to the selecting sections 260a and 260b the change positions of the clock signal.

The selecting section 260a selects as the reception clock data value the value of the clock signal acquired using a strobe at a position shifted by 0.5 UI from the change position, and transmits the selected reception clock data value to the FIFO memory 270a. In other words, the receiving apparatus 120 acquires the reception clock data values using the same method as described above.

On the other hand, concerning the data signal, the selecting section 260b selects as a reception data value the value of the data signal acquired using a strobe at a position shifted by 0.5 UI from the change position of the clock signal, and transmits the selected reception data value to the FIFO memory 270b. In other words, the receiving apparatus 120 selects the value of the data signal with the change position of the clock signal as a reference, and can therefore suitably select a data value of the data signal synchronized with the clock signal.

The receiving apparatus 120 can suitably select a reception clock data value and a reception data value without using a complicated circuit synchronized with the clock signal output from the device under test 10. The device under test 10 may supply a clock signal that is constantly changing between the high level and the low level, and in such a case the receiving apparatus 120 can constantly detect the change positions of the clock signal with the clock period. Accordingly, the receiving apparatus 120 can always select reception data values for the data signal.

Figure 9:
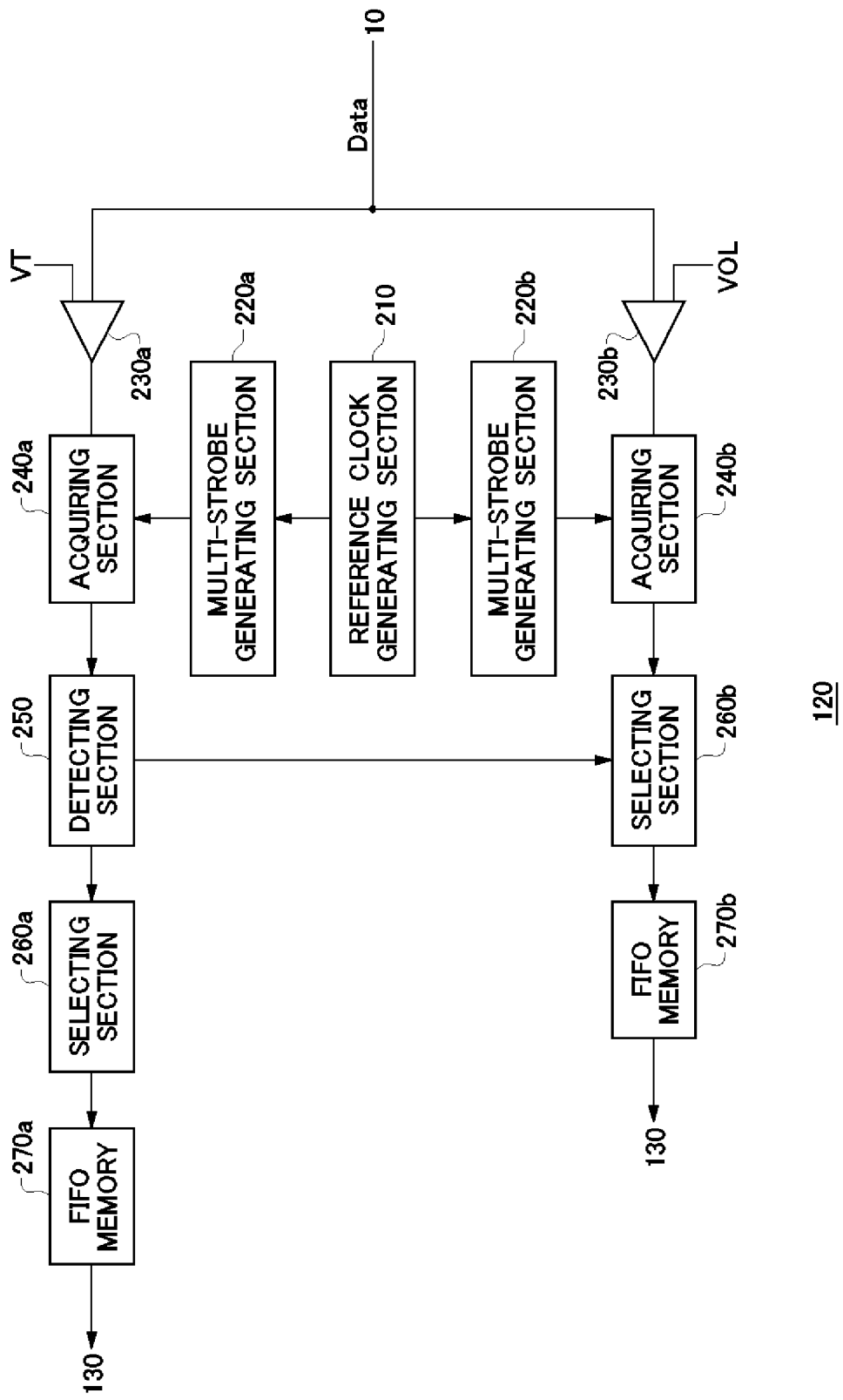
FIG. 9 shows a second modification of the receiving apparatus 120 according to the present embodiment.

FIG. 9 shows a second modification of the receiving apparatus 120 according to the present embodiment. The receiving apparatus 120 of the present modification adopts the same function and configuration as the receiving apparatus 120 shown in FIG. 2, and therefore components that are the same as those of the receiving apparatus 120 shown in FIG. 2 are given the same reference numerals and only differing points are included in the following description. The device under test 10 supplies the receiving apparatus 120 with a data signal as a single-ended signal. Instead, the device under test 10 may supply the receiving apparatus 120 with the data signal as a differential signal.

The receiving apparatus 120 includes a first acquiring section 240a that uses each of the strobes to acquire the logic value of the reception signal according to whether the reception signal exceeds a first threshold value VT and supplies the detecting section 250 with the acquired logic value, and a second acquiring section 240b that uses each of the strobes to acquire the logic value of the reception signal according to whether the reception signal exceeds a second threshold value VOL. In the receiving apparatus 120, the detecting section 250 detects a change position at which the reception signal exceeds the first threshold voltage VT, and the selecting section 260a selects as a reception data value the value of the reception signal acquired using a strobe at a position shifted by 0.5 UI from the change position and transmits the selected reception clock data value to the FIFO memory 270a.

The selecting section 260b transmits to the FIFO memory 270b, as reception data values, a plurality of reception signal values acquired using a plurality of strobes along with information concerning the positions of these reception signal values relative to the change position. In other words, the receiving apparatus 120 transmits to the FIFO memory 270b a plurality of reception data values indicating whether the reception signal acquired using a plurality of strobes exceeds the second threshold value VOL, along with information concerning the temporal positions of these reception data values relative to the change position at which the reception signal exceeds the first threshold value VT.

Figure 10:
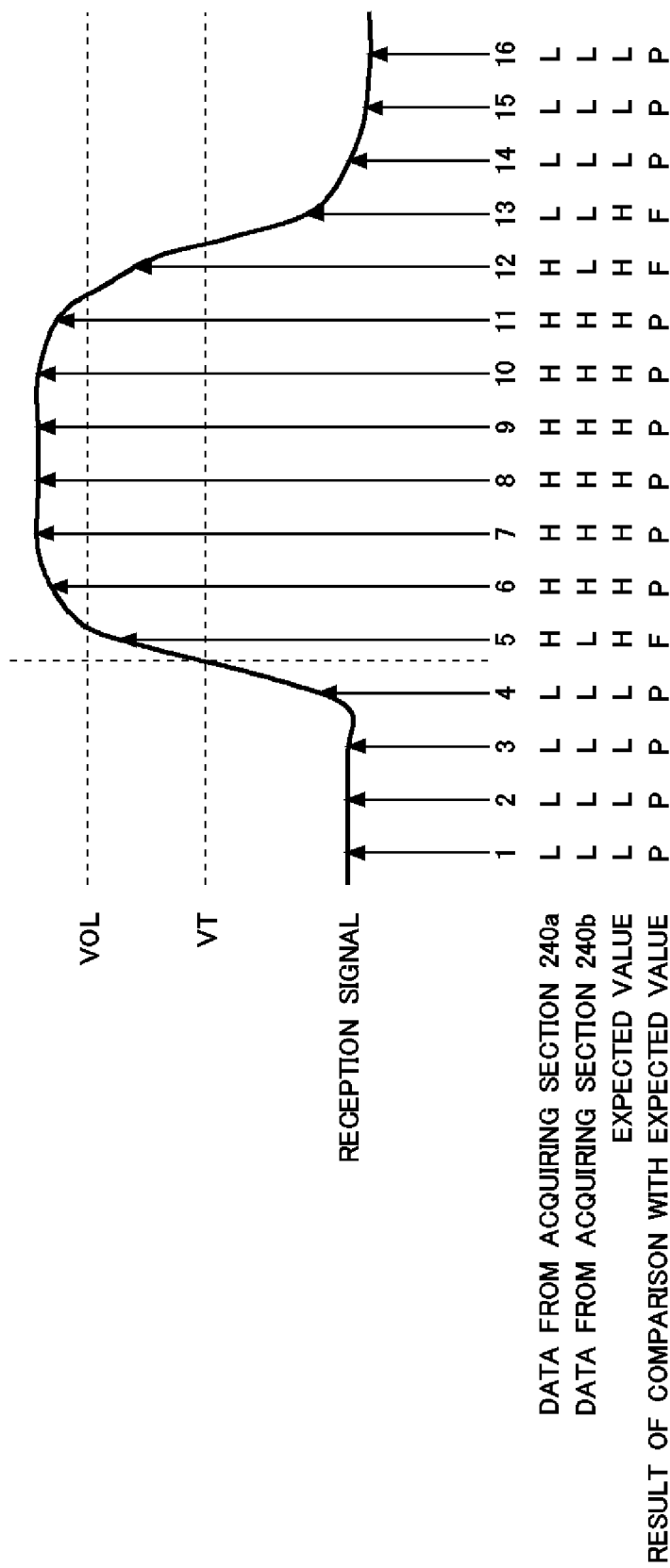
FIG. 10 shows exemplary logic values of the reception signal acquired by the second modification of the receiving apparatus 120 according to the present embodiment.

FIG. 10 shows exemplary logic values of the reception signal acquired by the second modification of the receiving apparatus 120 according to the present embodiment. The first acquiring section 240a may use the strobes generated by the multi-strobe generating section 220a to acquire logic values of the reception signal corresponding to whether the reception signal exceeds the first threshold value VT, such as the logic values shown by the data of the acquiring section 240a in FIG. 10. Since the position of the strobe at which the reception signal exceeds the first threshold value VT is the fifth position, the detecting section 250 may transmit the change position to the selecting section 260a and the selecting section 260b as the fourth strobe position.

The second acquiring section 240b may use the strobes generated by the multi-strobe generating section 220b to acquire logic values of the reception signal corresponding to whether the reception signal exceeds the second threshold value VOL, such as the logic values shown by the data of the acquiring section 240b in FIG. 10. In this way, the second modification of the receiving apparatus 120 can acquire a plurality of reception data values indicating whether the reception signal acquired using strobes at temporally uniform intervals exceeds the second threshold value VOL, with the change position corresponding to whether the reception signal exceeds the first threshold value VT as a reference.

Figure 11:
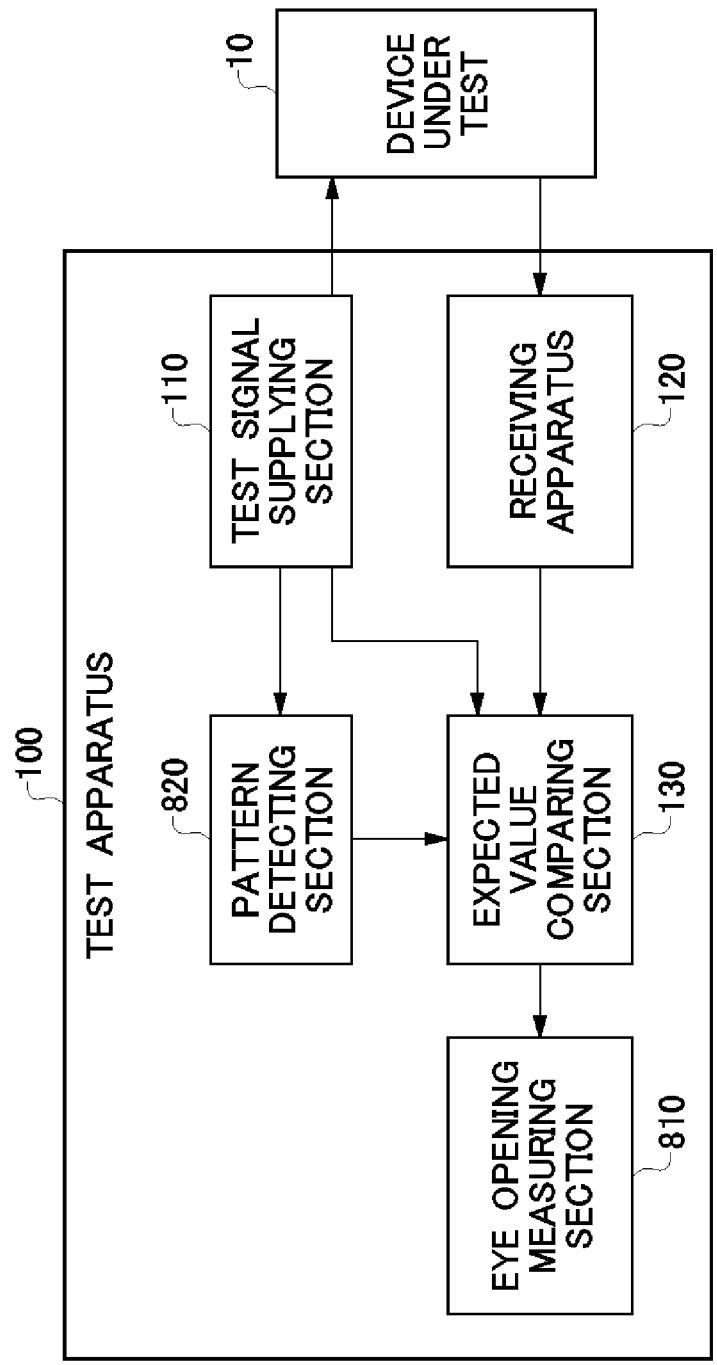
FIG. 11 shows a modification of the test apparatus 100 according to the present embodiment.

FIG. 11 shows a modification of the test apparatus 100 according to the present embodiment. The modification of the test apparatus 100 according to the present embodiment includes a test signal supplying section 110, the second modification of the receiving apparatus 120, an expected value comparing section 130, an eye opening measuring section 810, and a pattern detecting section 820.

The eye opening measuring section 810 measures the eye opening of the reception signal based on comparison results obtained by the expected value comparing section 130 comparing the logic values of the reception signal acquired by the second acquiring section 240b using each strobe to the second threshold values. The pattern detecting section 820 detects that the sequence of reception data values matches a predetermined expected pattern.

The test apparatus 100 compares the logic values of the reception signal from the second acquiring section 240b and output by the receiving apparatus 120 to the expected values generated by the test signal supplying section 110. For example, the test signal supplying section 110 may generate the data sequence shown by the expected values in FIG. 10, and the expected value comparing section 130 may express the comparison results as Pass/Fail, as shown by the comparison results with the expected values in FIG. 10. The eye opening measuring section 810 measures the eye opening of the reception signal based on the comparison results from the expected value comparing section 130 for each of the second threshold values.

Figure 12:
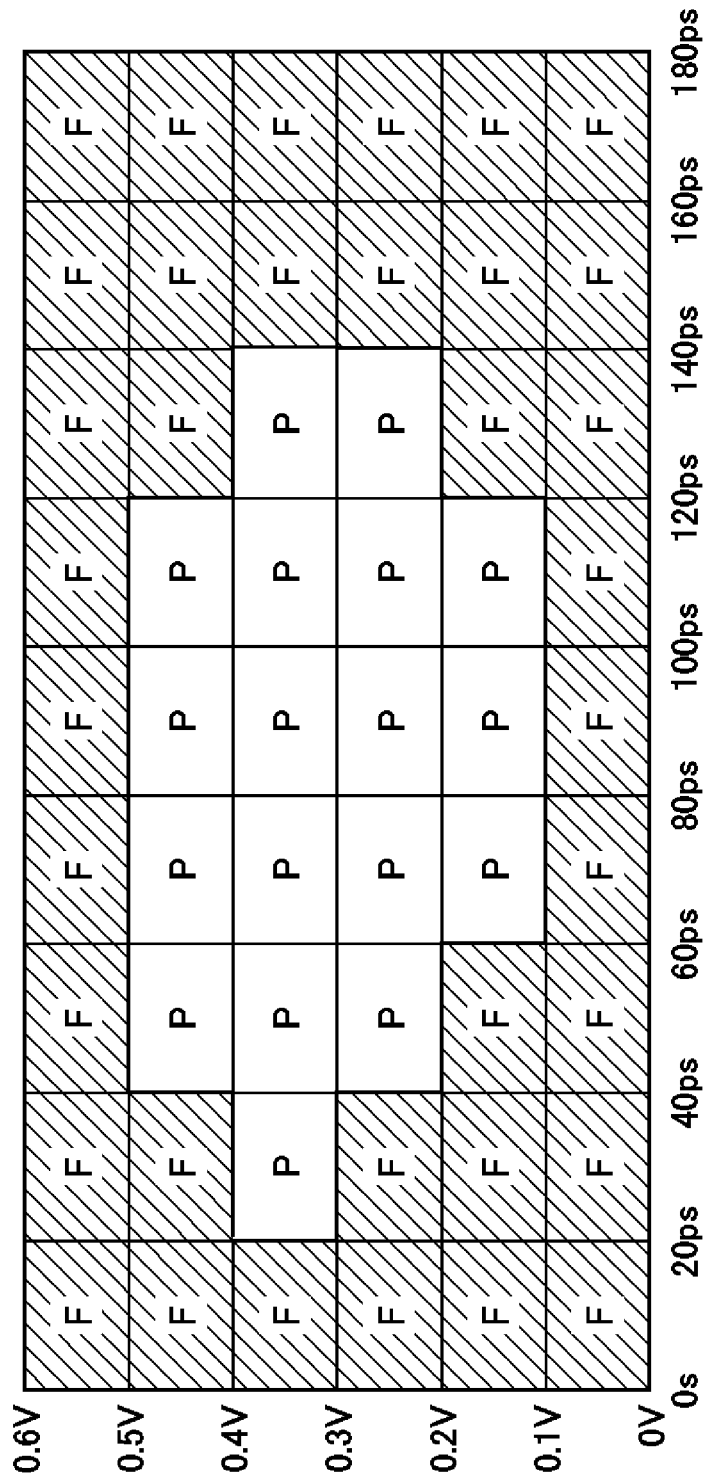
FIG. 12 shows an exemplary eye pattern output by the modification of the test apparatus 100 according to the present embodiment.

FIG. 12 shows an exemplary eye pattern output by the modification of the test apparatus 100 according to the present embodiment. The eye opening measuring section 810 may measure an eye opening indicating a Pass region by generating a pattern known as a shmoo plot indicating the comparison results of the expected value comparing section 130 with the horizontal axis representing relative time from the change position and the vertical axis representing the second threshold value. For example, the eye opening measuring section 810 acquires "F, P, P, P, P, P, P, F, F," which corresponds to the sixth to thirteenth pieces of data of the strobes in FIG. 10, as the result of the comparison with the expected values observed for each time that is a uniform interval from the comparison position.

Here, when the strobe intervals are 20 ps and the second threshold value VOL is 0.4 V, the eye opening measuring section 810 may display this data in the row between 0.3 V and 0.4 V in FIG. 12. In this way, the eye opening measuring section 810 can measure the eye opening of the reception signal by arranging the comparison results with the expected values acquired for each of the second threshold values in a plane where the horizontal axis represents relative time from the change position and the vertical axis represents the second threshold value. As a result, the test apparatus 100 can acquire Pass/Fail information in the direction of the time axis by measuring one cycle with a multi-strobe, and can therefore measure the eye opening in a short time using a shmoo plot obtained by performing sweep measuring with the second threshold value as a parameter.

The detecting section 250 detects the change position at which the value of the reception signal changes based on the detection result of the first acquiring section 240a, the first selecting section 260a selects as the reception data value the logic value of the reception signal acquired by the first acquiring section 240a using a strobe at a position shifted by a predetermined phase amount from the change position, and the eye opening measuring section 810 measures the eye opening based on the comparison results and a condition that the sequence of the reception data values matches the expected pattern. When the test apparatus 100 sequentially acquires results of the comparison to each expected value using the second threshold value set for each cycle while there is shifting of the cycle in the reception data, the cycle shifting is reflected in the shmoo plot, making it impossible to correctly measure the eye opening.

Therefore, the pattern detecting section 820 detects that (i) the logic value of the reception signal acquired using a strobe at a position shifted by a predetermined phase from the change position and sent by the first selecting section 260a matches (ii) the predetermined expected pattern indicating the sequence of the reception data values. The eye opening measuring section 810 can correct the cycle shifting by acquiring comparison results on a condition that the sequence of reception data values matches the expected pattern. As a result, the test apparatus 100 can accurately measure the eye opening.

The modification of the test apparatus 100 according to the present embodiment described above displays Pass/Fail information, such as shown in FIG. 12, as the eye opening measurement, but the test apparatus 100 may instead display a Pass/Fail count. In other words, the test apparatus 100 can display statistical information concerning the eye opening by repeating a cycle having the same measurement conditions, counting the number of pieces of Pass information and Fail information for each strobe having the same measurement conditions, and displaying the count results.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A receiving apparatus comprising:
a multi-strobe generating section that generates a plurality of strobes having different phases with respect to a reception signal;
an acquiring section that acquires a value of the reception signal at each of the strobes;
a detecting section that detects a change position at a first strobe of the plurality of strobes in which the acquired value of the reception signal changed;
a selecting section that selects, as a reception data value, the value of the reception signal acquired at a second strobe of the plurality of strobes at a position shifted by a predetermined phase from the change position.

2. The receiving apparatus according to claim 1, further comprising a reference clock generating section that generates a reference clock having a plurality of pulses according to a pulse frequency during a cycle having a preset period, wherein the multi-strobe generating section generates one of the plurality of strobes for each pulse of the reference clock.

3. The receiving apparatus according to claim 2, wherein the preset period is substantially similar to a period of the reception signal.

4. The receiving apparatus according to claim 1, wherein the selecting section selects two or more sequential reception data values in response to detecting two or more change positions.

5. The receiving apparatus according to claim 1, wherein when there are no strobes corresponding to the position shifted by the predetermined phase from the change position in a current cycle, instead of selecting the reception data value based on the acquisition result in the current cycle, the selecting section selects as the reception data value the value of the reception signal acquired using the second strobe corresponding to the position shifted by the predetermined phase from the change position in one of a previous cycle and a subsequent cycle.

6. The receiving, apparatus according to claim 1, further comprising a FIFO memory that buffers, using first-in first-out buffering, the reception data values sequentially selected by the selecting section, and outputs a reception data value for each cycle.

7. The receiving apparatus according to claim 1, Wherein the multi-strobe generating section generates the plurality of strobes over a time width greater than or equal to 1.5 times a period of the reception signal.

8. The receiving apparatus according to claim 1, wherein the multi-strobe generating section generates each of the plurality of strobes at a uniform time interval spread over a time width that is greater than or equal to a sum of 1.5 times a period of the reception signal and two of the uniform time intervals.

9. The receiving apparatus according to claim 1, wherein when unable to detect the change position based on the acquisition result of the acquiring section, the detecting section determines the change position corresponding to current reception data of the reception signal to be the detected change position corresponding to previous reception data in the reception signal.

10. The receiving apparatus according to claim 1, wherein when unable to detect the change position based on the acquisition result of the acquiring section, the detecting section interpolates the change position corresponding to current reception data of the reception signal based on two or more change positions detected for two or more periods of reception data that are not in the current reception data of the reception signal.

11. The receiving apparatus according to claim 10; wherein the detecting section interpolates the change position corresponding to the current reception data of the reception signal based on two or more detected change positions corresponding to two or more previous periods of reception data in the reception signal.

12. The receiving apparatus according to claim 10, wherein the detecting section interpolates the change position in a current cycle of the reception signal based on two or more change positions detected in two or more cycles that include a cycle before the current cycle and as cycle after the current cycle in the reception signal.

13. The receiving apparatus according to claim 1, wherein the selecting section selects as the reception data value the value of the reception signal acquired using the second strobe at a position shifted by the predetermined phase from a change position detected in a cycle that is a predetermined number of cycles earlier.

14. The receiving apparatus according to claim 1, wherein the selecting section selects as the reception data value the value of the reception signal acquired using the second strobe at a position shifted by the predetermined phase from an averaged position of the change position in a plurality of cycles.

15. A receiving method comprising:
generating a plurality of strobes having different phases with respect to a reception signal;
acquiring a value of the reception signal at each of the strobes;
detecting a change position at a first strobe of the plurality of strobes in which the acquired value of the reception signal changed; and
selecting, as a reception data value, the value of the reception signal acquired at a second strobe of the plurality of strobes at a position shifted by a predetermined phase from the change position.

16. A method comprising:
selecting a reception data value of a reception signal from a plurality of values, each value acquired at one of a plurality of strobes having different phases with respect to the reception signal, the reception data value acquired at a first strobe of the plurality of strobes at a position shifted by a predetermined phase from a change position, the change position at a second strobe of the plurality of strobes in which the acquired value changed.

* * * * *